(12) United States Patent
Farrar

(10) Patent No.: US 6,559,076 B1
(45) Date of Patent: May 6, 2003

(54) METHOD OF REMOVING FREE HALOGEN FROM A HALOGENATED POLYMER INSULATING LAYER OF A SEMICONDUCTOR DEVICE

(75) Inventor: Paul A. Farrar, South Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/377,070

(22) Filed: Aug. 19, 1999

(51) Int. Cl.[7] .................. H01L 21/26; H01L 21/324
(52) U.S. Cl. ............... 438/798; 438/474; 438/623; 438/758; 438/780; 438/781; 438/795
(58) Field of Search ................ 438/474, 475, 438/623, 758, 778, 780, 781, 798, 725, 795

(56) References Cited

U.S. PATENT DOCUMENTS

| | | | | |
|---|---|---|---|---|
| 4,173,683 A | * | 11/1979 | Comizzoli | 438/124 |
| 5,268,202 A | | 12/1993 | You et al. | 427/255.6 |
| 5,380,317 A | * | 1/1995 | Fukuyama et al. | 216/67 |
| 5,380,401 A | | 1/1995 | Jones et al. | 156/665 |
| 5,629,246 A | * | 5/1997 | Iyer | 438/763 |
| 5,879,808 A | | 3/1999 | Wary et al. | 428/411.1 |
| 5,930,655 A | * | 7/1999 | Cooney, III et al. | 438/474 |
| 6,077,764 A | * | 6/2000 | Sugiarto et al. | 438/597 |
| 6,080,640 A | * | 6/2000 | Gardner et al. | 438/455 |
| 6,265,320 B1 | * | 7/2001 | Shi et al. | 438/725 |
| 6,323,119 B1 | * | 11/2001 | Xi et al. | 438/627 |
| 6,355,576 B1 | * | 2/2002 | Haley et al. | 438/745 |

FOREIGN PATENT DOCUMENTS

JP  411158218 A * 6/1999 ............. C08F/8/22

OTHER PUBLICATIONS

Jenq et al. (PCT/US99/25213), May 2000.*
W. Kunstler et al. "Surface–charging behavior of plasma treated polymer films", 1998, IEEE, pp. 609–612.*
Stanley Wolf et al. "Silicon Processing for the VLSI Era", 1986, vol. 1, p. 543.*
Wang et al.; "Evaluation of TaNx and Al as Barriers to Fluorine Diffusion from Fluorinated Parylenes" DUMIC Conference Feb. 16–17, 1998; pp. 245–252.

* cited by examiner

Primary Examiner—Amir Zarabian
Assistant Examiner—Maria Guerrero
(74) Attorney, Agent, or Firm—Dickstein Shapiro Morin & Oshinsky LLP

(57) ABSTRACT

A method is disclosed for removal of free halogen from a semiconductor device insulating layer, in particular, a halogen-containing polymer insulating layer. The free halogen is removed by contacting the insulating material with hydrogen ions under conditions which generate gaseous hydrogen halide which is then removed. A semiconductor device containing such treated insulating materials is also disclosed. The invention is particularly useful in removing free fluorine from fluorinated polymer insulating layers.

28 Claims, 5 Drawing Sheets

METHOD OF REMOVING FREE HALOGEN FROM A HALOGENATED POLYMER INSULATING LAYER OF A SEMICONDUCTOR DEVICE

FIELD OF THE INVENTION

This invention relates to semiconductor device manufacturing. More particularly, the present invention is directed to a simplified method for removing free halogen, in particular fluorine, from a halogenated polymer layer used as an insulating layer in a semiconductor device.

BACKGROUND OF THE INVENTION

The integrated circuit manufacturing industry continuously progresses toward more highly advanced and miniaturized integrated circuits. With this progress toward smaller and smaller dimensions, the capacitive loading of wiring levels has become a more and more significant problem. Traditionally, $SiO_2$ has been used to provide insulation between conductive areas. In order to reduce the capacitance of conductive areas, efforts have been made to use materials other than $SiO_2$ to form insulating layers, that is, materials having a lower dielectric constant than that of $SiO_2$. Various groups of materials have been identified and/or developed for this purpose, including various types of halogenated polymers, such as fluorinated parylenes (paraxylylenes) and fluorinated polyimides. Fluorinated parylenes, and methods of making them, are well known in the art (see, e.g., U.S. Pat. Nos. 5,268,202 and 5,879,808, the entireties of which are hereby incorporated by reference). Likewise, fluorinated polyimides, and methods of making them, are well known to those skilled in the art.

In the manufacture of semiconductor devices, it is frequently necessary to form vias through such insulating layers, which is typically accomplished by any of a wide variety of etching techniques known in the art, e.g., reactive ion etching (RIE). In the case of damascene techniques, wherein trenches are formed in insulating layers and filled with conductive material, it is necessary to etch processing channels for the wiring. It has been observed that when such etching techniques are applied to fluorinated polymers, free fluorine tends to be produced. For example, a well known and preferred type of etching technique for forming vias and/or trenches in insulating layers is reactive ion etching, e.g., using an oxygen plasma. When an oxygen plasma is used to form vias and/or trenches in a fluorinated polymer such as fluorinated parylene, a majority of the free fluorine which is produced exits the polymer in the form of $F_2O$, but some free fluorine remains in the fluorinated polymer. Such free fluorine cannot be removed using oxygen plasma because such a treatment would cause further etching, thereby enlarging the etched areas beyond what is desired. Moreover, such further treatment would generate additional free fluorine.

Free fluorine produced in insulating layers can cause a variety of problems in semiconductor devices, e.g., it can diffuse into and contaminate other layers in the semiconductor device. Accordingly, in order to use fluorine or other halogenated polymers as insulating layers, it would be desirable, and in some cases it would be necessary, to either remove the free halogen and/or block the free halogen from diffusing into other layers in which free halogen is undesirable or deleterious.

Wang, et al., "Evaluation of TaNx and Al as Barriers to Fluorine Diffusion from Fluorinated Parylenes" discloses barriers which are designed to prevent free fluorine from reaching sensitive areas within semiconductor devices.

U.S. Pat. No. 5,380,401 discloses a method of removing fluorine contaminants from an aluminum-containing semiconductor bond pad, comprising exposing the bond pad to argon in a reactive ion etcher, and applying energy to the argon.

There is a need for a method of easily and effectively removing free halogen from insulating materials which contain such free halogen, e.g., free fluorine, without significantly adding to processing time or processing cost, and without etching or degrading the insulating layer, so as to avoid the need for adding a free halogen blocking layer to the device.

SUMMARY OF THE INVENTION

According to the present invention, there are provided simple methods which, as discussed in more detail below, provide for effective removal of free halogen from insulating materials which contain free halogen, in particular, a halogen-containing polymer which has been subjected to one or more etching techniques. The methods according to the present invention achieve such free halogen removal and do not significantly add to processing time or processing cost, without etching or degrading the insulating layer, thereby avoiding the need for adding a halogen-blocking layer.

According to one aspect of the present invention, there are provided methods of removing free halogen from a halogenated polymer, by contacting the halogenated polymer with hydrogen ions to generate hydrogen halide. The halogenated polymer is preferably contacted with the hydrogen ions at a temperature and pressure at which the hydrogen halide is gaseous. Alternatively, the temperature can be increased and/or the pressure can be decreased following generation of hydrogen halide to render the hydrogen halide gaseous.

There are further provided methods of forming semiconductor devices comprising contacting a free halogen containing insulating material layer of the semiconductor device with hydrogen ions.

In addition, there are further provided methods of forming semiconductor devices comprising, applying an insulating layer containing halogen onto a substrate, etching a pattern in at least the insulating layer, thereby generating free halogen in the insulating layer, and contacting the insulating layer with hydrogen ions to convert free halogen to hydrogen halide. The insulating layer is preferably formed of a halogenated polymer.

There are also provided semiconductor devices formed as described above. Although the invention is applicable to any halogen containing insulating layer, the invention is preferably used to remove free fluorine from a fluorinated polymer, preferably selected from the group consisting of fluorinated parylenes and fluorinated polyimides.

These and other features and advantages of the invention will become more readily apparent from the following detailed description of preferred embodiments of the present invention which is provided in conjunction with the accompanying drawings. The invention is not limited to the exemplary embodiments described below and it should be recognized that the invention includes all modifications falling within the scope of the attached claims.

DETAILED DESCRIPTION OF PREFERRED EMBODIMENTS OF THE INVENTION

Figure 1:
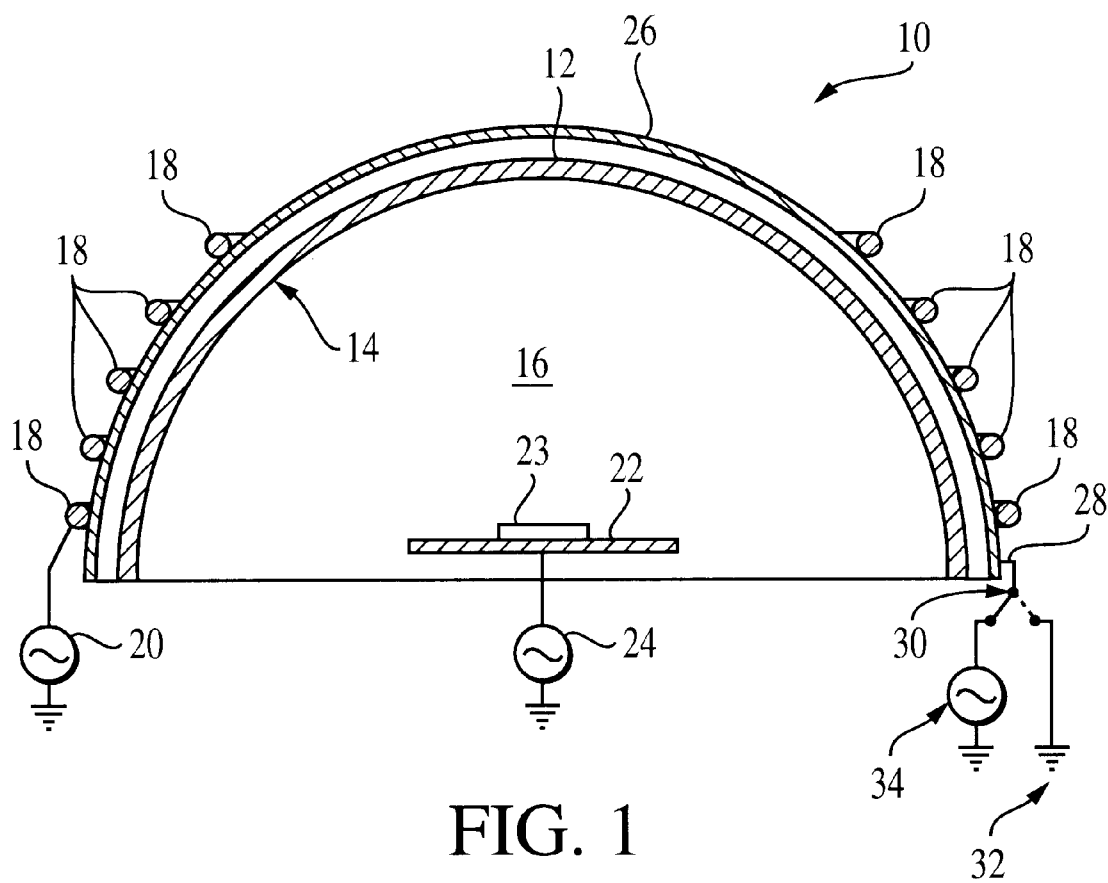
FIG. 1 is a diagrammatic sectional view of a plasma reactor which is suitable for use in carrying out methods according to the present invention.

As mentioned above, a first aspect of the present invention relates to removing free halogen from a material to be used as an insulating layer in a semiconductor device. The insulating layer in accordance with this aspect of the invention is preferably a halogenated polymer.

In a second aspect of the present invention, there is provided a method of removing free halogen from a halogenated polymer.

Preferred materials for use as the insulating layer of the first aspect of the present invention or the halogenated polymer of the second aspect of the present invention include halogenated parylenes and halogenated polyimides, with the preferred halogen being fluorine. Those of skill in the art can readily manufacture halogenated parylenes and halogenated polyimides using techniques known in the art. The parylene and/or polyimide used in accordance with the present invention is preferably halogenated substantially to the maximum possible extent, i.e., all hydrogen atoms are preferably replaced with halogen atoms. It is preferred that all such substitutions be with fluorine, although it is possible to use other halogens (in particular, chlorine, bromine or iodine) and/or combinations of halogens. In addition, the present invention covers any other suitable halogenated polymers, including parylenes and polyimides in which some of the mers are substituted with substituents other than halogens, so long as at least some of the mers are substituted with one or more halogen in at least one position.

According to the present invention, free halogen in the material to be used as an insulating layer, e.g. a halogenated polymer, is removed by contacting the material with hydrogen ions to generate hydrogen halide. The insulating material and/or the halogenated polymer is preferably contacted with the hydrogen ions at a temperature and pressure at which the hydrogen halide is gaseous.

In preferred cases, the free halogen is fluorine and the insulating material and/or the halogenated polymer is contacted with hydrogen ions. The boiling point of hydrogen fluoride (HF) at atmospheric pressure is about 19.4° C. Hydrogen plasma reactions are typically conducted under sub-atmospheric pressure conditions. Accordingly, ambient temperature conditions are usually sufficient to generate gaseous HF in such cases, and such HF readily can be vented from the insulating material. The temperature surrounding the material from which free halogen is being removed can be elevated to increase the rate of reaction. For example, the surrounding temperature can preferably be elevated to at least about 100° C.

Alternatively, the material from which free halogen is being removed can be contacted with hydrogen ions under conditions at which the hydrogen halide which is generated is not gaseous, and then the temperature can be increased and/or the pressure can be decreased following generation of hydrogen halide to render the hydrogen halide gaseous.

Those of skill in the art can readily recognize that a wide variety of conditions could be employed to achieve the functions of the present invention. For instance, the pressure in the environment surrounding the material from which free halide is being removed (i.e., the insulating material and/or the halogenated polymer) during contact with hydrogen ions can be lower or higher than atmospheric pressure, and the temperature can be selected such that the hydrogen halide is gaseous. In addition, it is possible to generate hydrogen halide under conditions at which the hydrogen halide is not gaseous, and later alter the conditions to render the hydrogen halide gaseous.

The hydrogen being used to form hydrogen halide with the free halide is preferably ionized either as it contacts the insulating layer from which free halide is being removed, or prior to contacting the insulating layer.

Figure 2:
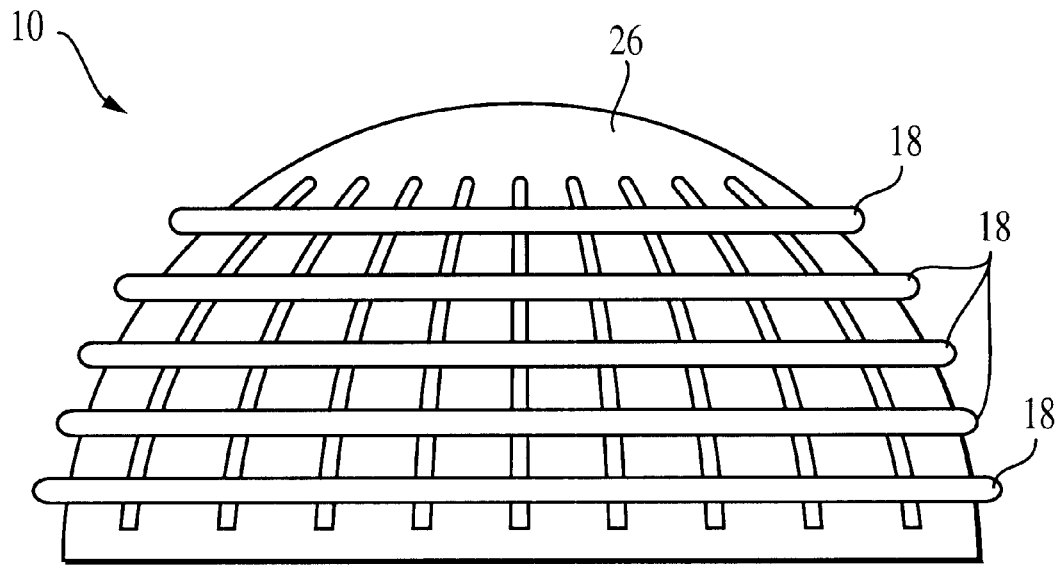
FIG. 2 is a diagrammatic side elevational view of the plasma reactor depicted in FIG. 1.

A suitable way to generate hydrogen ions is through the use of a low pressure plasma reactor. A representative example of such a device is shown in FIGS. 1 and 2. FIGS. 1 and 2 depict a suitable plasma reactor apparatus 10 for use in accordance with the present invention. The plasma reactor apparatus 10 comprises an electrically insulative shell 12 having internal walls 14. The walls 14 define an internal reactor cavity 16. An example of a suitable material for construction of the shell 12 is quartz. Electrically conductive inductive coils 18 are positioned externally of the cavity 16 and the shell 12, and wrap therearound. The inductive coils 18 constitute an inductive coupling means positioned externally of the cavity 16 for inductively generating and transmitting electromagnetic radiation into the reactor cavity 16 to ionize gases therein into a plasma state. The coils 18 are powered by a suitable conventional power supply 20. A representative example of a suitable power supply is 13.56 MHz and 3000 watts. An internal electrode 22 is provided for supporting a workpiece 23, i.e., the material being treated (in the present embodiment, the workpiece is a semiconductor wafer). The internal electrode 22 is as well connected to a conventional capacitively coupled bias power source 24 which could be used for anisotropic etching. A capacitive coupling plate 26 is positioned externally of the cavity 16 and the shell 12, intermediate the cavity 16 and the inductive coils 18. A capacitive coupling plate 26 is connected via a conductive line 28 to a switch 30. The switch 30 is operable to connect the plate 26 to one of a ground source/potential 32 or a power source 34. The power source 34 can suitably be configured for operating at a frequency from 100 KHz to 60 MHz. The plate 26, the line 28, the switch 30 and the power supply 34 comprise a capacitive coupling system positioned externally of the cavity 16 for capacitively generating and transmitting electromagnetic radiation into the reactor cavity to ionize gas therein into a plasma state, and for drawing plasma ions in the direction of the plate 26 system. Such provides but one example of a capacitive coupling system. Others, of course, would be also suitable. For example, a capacitive coupling system could be provided wherein the plate 26 is positioned other than intermediate the cavity 16 and the coils 18.

The plasma reactor described above is merely one example of a plasma reactor which could be used in practicing the present invention, and those of skill in the art will recognize that any reactor which would, be suitable for generating hydrogen ions would be suitable for use in accordance with the present invention.

The hydrogen ions are preferably substantially the only material contacting the material from which free halide is being removed, although it is possible for other materials to be present (i.e., other than, the hydrogen halide being formed). If other materials are present, such other materials preferably do not substantially etch the material from which hydrogen halide is being removed.

The above-described techniques are simple methods which provide for effective removal of free halogen from materials which contain free halogen, in particular, halogen-containing polymer which has been subjected to one or more etching techniques. The methods of the present invention achieve such free halogen removal without significantly adding to processing time or processing cost, and without etching or degrading the insulating layer.

The present invention is further directed to methods of forming semiconductor devices comprising applying an insulating layer containing halogen onto a substrate, etching a pattern in the insulating layer, thereby generating free halogen in the insulating layer, and contacting the insulating layer with hydrogen ions to convert free halogen to hydrogen halide.

A representative embodiment of a method of forming a semiconductor device according to the present invention is depicted in FIGS. 3A–3D. Those of skill in the art will recognize that the semiconductor device shown in FIGS. 3A–3D is only one example of semiconductor devices which can be made according to the present invention, and that the present invention is applicable to any type semiconductor device containing a halogenated insulating layer in which free halogen is produced during semiconductor fabrication. Thus, there may be numerous integrated circuit device structures below and/or above the insulating layer illustrated in FIGS. 3A–3D, but since the invention can be applied to any semiconductor device, only the layers affected by the present invention are being described and illustrated.

In addition, the expression "layer" is used herein to refer to either a single stratum or a plurality of strata. In other words, those of skill in the art are familiar with the fact that a stratum having one or more particular features (e.g., composition) can be replaced with a series of strata which provides a similar function.

Furthermore, the expression "substrate" is used herein to refer to either a single layer, or one or more layers of materials on a base layer.

Figure 3A:
FIG. 3A is a cross-sectional view of a substrate according to an embodiment of the present invention.

FIG. 3A is a cross-sectional view of a substrate 60. The substrate 60 can be any suitable substrate, and can be formed according to any of the various methods known for forming a substrate. It may be a layer of silicon, or it may be formed by a plurality of material layers and may also contain portions of or complete electronic devices fabricated in the substrate.

Figure 3B:
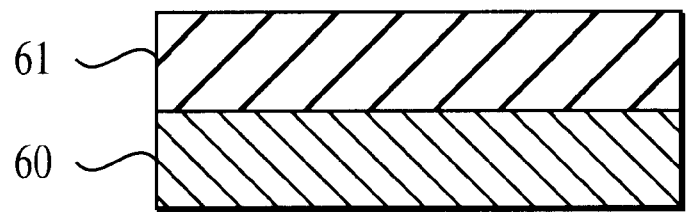
FIG. 3B is a cross-sectional view of the FIG. 3A structure at a later stage.

An insulating layer 61 is applied to the substrate 60. As mentioned above, the insulating layer 61 is formed of a halogenated polymer, such as a fluorine containing polymer. The step of applying a halogenated polymer can be conducted in any suitable manner, e.g. spin coating, depending on the nature of the halogenated polymer. The halogenated polymer is preferably cured (or allowed to cure) before further processing. FIG. 3B is a cross-sectional view of a laminate of the substrate 60 and the insulating layer 61.

Figure 3C:
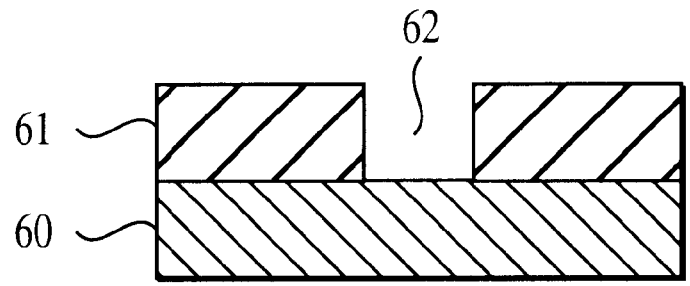
FIG. 3C is a cross-sectional view of the FIG. 3B structure and a later stage of processing.

At least one via is etched in the insulating layer 61. The etching can be conducted in any suitable manner, numerous types of etching being known in the art and being suitable. As mentioned above, a preferred example of a suitable etching method is by reactive ion etching, most preferably, using an oxygen plasma method. As mentioned above, oxygen plasma etching (as with any other type of etching) causes the generation of free halogen, but also eliminates a significant amount of the thus-generated free halogen in the form of oxide of the halogen, e.g. $F_2O$. FIG. 3C is a cross-sectional view of the laminate of FIG. 3B which has been etched according to the third embodiment of the present invention, this view showing a via 62. The FIG. 3C structure is then contacted with hydrogen ions as discussed above to produce hydrogen halide. The insulating material and/or the halogenated polymer is preferably contacted with the hydrogen ions at a temperature and pressure at which the hydrogen halide is gaseous. Alternatively, after contact of the halogenated polymer with hydrogen ions the temperature and/or pressure can be adjusted to form gaseous hydrogen halide.

Figure 3D:
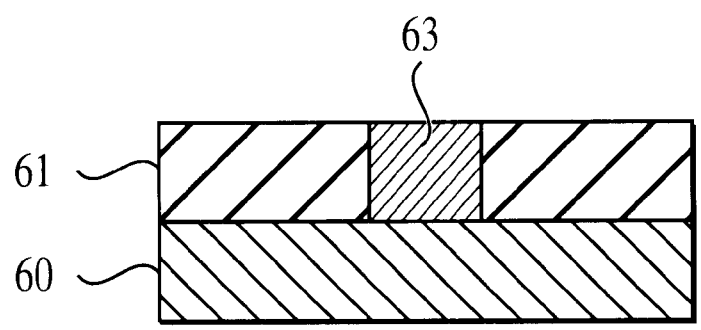
FIG. 3D is a cross-sectional view of the FIG. 3C structure at a later stage of processing.

Next a conductive material is deposited into the via 61. FIG. 3D is a cross-section view of the laminate of FIG. 3C which includes a conductive material 63 deposited in the via 62.

The structure of FIG. 3D can then be subject to further conventional fabrication steps to produce an operative semiconductor device.

The invention may also be used to produce multi-layer interconnects in semiconductor devices, as illustrated in FIGS. 4A–4E.

Figure 4A:
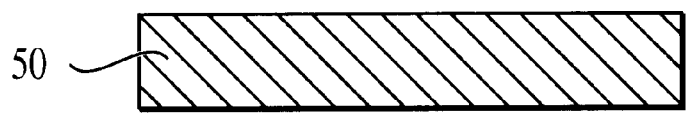
FIG. 4A is a cross-sectional view of a substrate according to a second embodiment of the present invention.
Figure 4B:
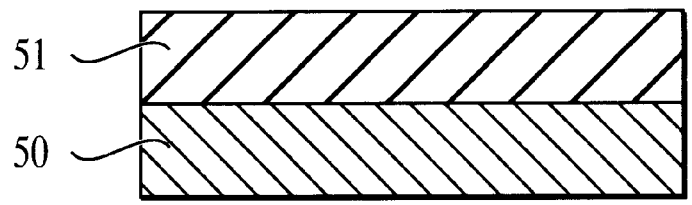
FIG. 4B is a cross-sectional view of the FIG. 4A structure at a later stage of processing.
Figure 4C:
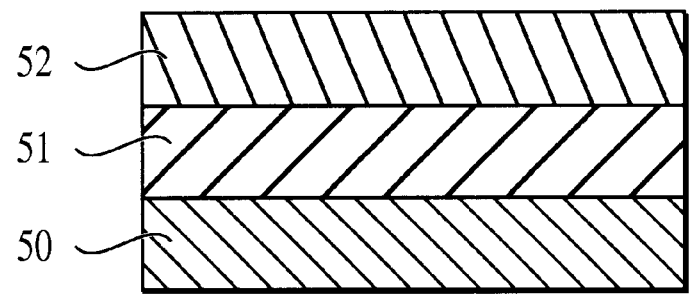
FIG. 4C is a cross-sectional view of the FIG. 4B structure at a later state of processing.
Figure 4D:
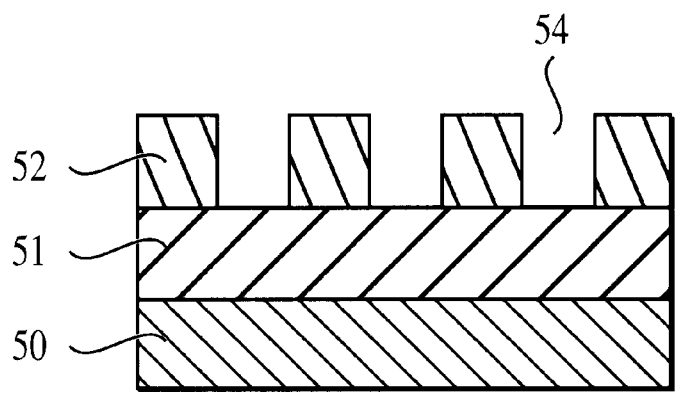
FIG. 4D is a cross-sectional view of the FIG. 4C structure at a later stage of processing.
Figure 4E:
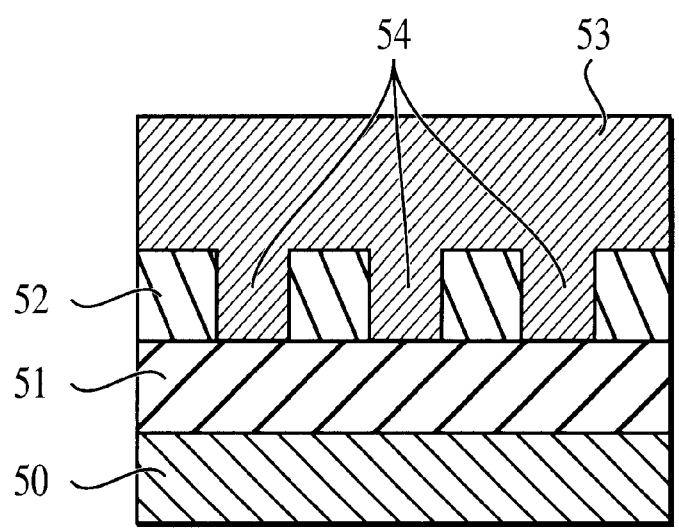
FIG. 4E is a cross-sectional view of the FIG. 4D structure at a later stage of processing.

FIG. 4A illustrates a semiconductor substrate 50 which as in the prior embodiment, may include numerous material layers forming portions of or complete electronic devices. As shown in FIG. 4B a conductor layer 51 is applied on substrate 50. This may be a patterned interconnect layer for a semiconductor device. Next, as shown in FIG. 4C a hydrogenated polymer insulating layer 52 is applied, cured and then etched, as shown in FIG. 4D to form vias 54. This structure is then subject to hydrogen ion contact to remove free halogen and generate hydrogen halide in the manner described above with reference to FIG. 3C. Then, as shown in FIG. 4E a conductive layer 53 is applied to fill in the vias 54, and the FIG. 4E structure can be further fabricated in conventional manner to produce an operative semiconductor device.

The present invention is suitable for use in the manufacture of any kind of semiconductor device, e.g., a microprocessor, logic device, DSP, memory device etc.

The present invention is further directed to any sequence of process steps which includes performance of any of the processes in accordance with the present invention, in addition to any other process steps, including but not limited to coating or applying one or more additional layers, removing part of all of one or more additional layers, creating a pattern on a surface of a layer by applying, exposing and developing a photoresists and then removing portions of the layer defined by the pattern, forming interconnect holes through two or more layers, creating interconnects, etc.

As noted, the hydrogenated polymers with which the invention is preferably used are fluorinated parylenes and fluorinated polyamides in which case the removed free halogen is fluorine.

Although articles and methods in accordance with the present invention have been described in connection with preferred embodiments, it will be appreciated by those skilled in the art that modifications not specifically described may be made without departing from the spirit and scope of the invention. Accordingly, the invention is not limited by the foregoing description, but is only limited by the scope of the appended claims.

What is claimed is:

1. A method of removing free halogen from a halogenated polymer comprising:
   providing a halogenated polymer insulating layer over a semiconductor substrate;
   curing said halogenated polymer insulating layer;
   contacting said halogenated polymer insulating layer with ionic hydrogen which reacts with free halogen in said polymer under conditions which generate gaseous halogen components, said ionic hydrogen being ionized prior to its contact with a surface of said polymer; and
   removing said gaseous halogen components.

2. A method as in claim 1 where the hydrogen is partially or completely ionized.

3. A method as in claim 1 where the temperature during or subsequent to said hydrogen contact is above 20° C.

4. A method as in claim 1 where said halogen is fluorine.

5. A method as in claim 4 wherein said polymer is a fluorinated polyimide.

6. A method as in claim 4 where said polymer is a fluorinated parylene.

7. A method as in claim 2, wherein said hydrogen ions are generated by a hydrogen plasma.

8. A method as in claim 1, wherein said halogen is selected from the group consisting of fluorine, chlorine, bromine and iodine.

9. A method as in claim 3, wherein said contacting is conducted at a temperature of at least about 100 degrees C.

10. A method of removing free halogen from a halogenated polymer, comprising:
    curing said halogenated polymer;
    contacting said cured halogenated polymer with hydrogen ions to generate hydrogen halide, said hydrogen ions being generated by a hydrogen plasma; and
    causing said hydrogen halide to be gaseous.

11. A method as in claim 10, wherein said halogen is selected from the group consisting of fluorine, chlorine, bromine and iodine.

12. A method as in claim 11, wherein said halogen is fluorine.

13. A method as in claim 11, wherein said halogenated polymer is selected from the group consisting of fluorinated parylenes and fluorinated polyimides.

14. A method of making a semiconductor device, comprising:
    contacting a free fluorine containing polymer of said semiconductor device with hydrogen ions generated by a hydrogen plasma, under conditions such that at least a portion of said free fluorine is converted into gaseous hydrogen fluoride, said free fluorine containing polymer being selected from the group consisting of fluorinated parylenes and fluorinated polyimides.

15. A method as recited in claim 14, wherein said contacting is conducted at a temperature above 20° C.

16. A method of making a semiconductor device, comprising:
    contacting a free fluorine containing polymer of said semiconductor device with hydrogen ions generated by a hydrogen plasma under conditions such that at least a portion of said free fluorine is converted into hydrogen fluoride, said free fluorine containing polymer being selected from the group consisting of fluorinated parylenes and fluorinated polyimides; and
    increasing the temperature and/or decreasing the pressure in an environment surrounding said polymer to render said hydrogen fluoride gaseous.

17. A method as in claim 16, wherein said fluorinated polymer is a fluorinated parylene.

18. A method as in claim 16 where said fluorinated polymer is a fluorinated polyimide.

19. A method of making a semiconductor device, comprising:
    providing a polymer layer containing fluorine over a substrate;
    curing said polymer layer;
    etching a pattern in said polymer layer, said etching generating free fluorine in said polymer layer;
    contacting said polymer layer with hydrogen ions under conditions such that at least a portion of said free fluorine is converted to gaseous hydrogen fluoride;
    removing said gaseous hydrogen fluoride; and
    filling said pattern with a conductive material.

20. A method as in claim 19, wherein said hydrogen ions are generated by a hydrogen plasma technique.

21. A method as in claim 19, wherein said fluorinated polymer is a fluorinated parylene.

22. A method as in claim 19 wherein said fluorinated polymer is a flourinated polyimide.

23. A method as in claim 19, wherein said contacting is conducted at a temperature greater than 20° C.

24. A method as in claim 19 wherein said contacting is conducted at a temperature and pressure at which said hydrogen fluoride is gaseous.

25. A method of making a semiconductor device, comprising:
    providing a polymer layer containing fluorine over a substrate layer;
    curing said polymer layer;
    etching at least one via within said polymer latter, said etching generating free fluorine in said polymer layer;
    contacting said polymer layer with hydrogen ions to convert at least a portion of said free fluorine to hydrogen fluoride;
    increasing the temperature and/or decreasing the pressure in an environment surrounding said polymer layer to render said hydrogen fluoride gaseous;
    removing said gaseous hydrogen fluoride; and
    providing a conductive material within said at least one via.

26. A method as in claim 25 wherein said hydrogen ions are generated by a hydrogen plasma.

27. A method as in claim 25, wherein said fluorinated polymer is a fluorinated parylene.

28. A method as in claim 25 wherein said fluorinated polymer is a fluorinated polyimide.

* * * * *